United States Patent [19]

Skerlos

[11] Patent Number: 4,516,170
[45] Date of Patent: May 7, 1985

[54] DUAL MODE UHF TUNING SYSTEM
[75] Inventor: Peter C. Skerlos, Arlington Heights, Ill.
[73] Assignee: Zenith Electronics Corporation, Glenview, Ill.
[21] Appl. No.: 564,177
[22] Filed: Feb. 4, 1984

Related U.S. Application Data
[63] Continuation of Ser. No. 367,656, Apr. 12, 1982, abandoned.
[51] Int. Cl.³ .............................................. H04N 5/44
[52] U.S. Cl. .................................. 358/191.1; 455/180
[58] Field of Search .......................... 358/191.1, 195.1; 455/158, 180, 182

[56] References Cited
U.S. PATENT DOCUMENTS

| 4,002,986 | 1/1977 | Ma ............................................. 455/180 |
| 4,015,192 | 3/1977 | Koyanagi ........................................ 323/19 |
| 4,078,212 | 3/1978 | Rast ............................................ 358/191.1 |
| 4,121,162 | 10/1978 | Alborkrack et al. ........................... 455/182 |
| 4,271,529 | 6/1981 | Strammello, Jr. ............................ 455/180 |
| 4,279,035 | 7/1981 | Skerlos ........................................ 455/158 |
| 4,280,140 | 7/1981 | Skerlos ...................................... 358/195.1 |
| 4,302,778 | 11/1981 | Tanaka ........................................ 455/182 |

Primary Examiner—Richard Murray

[57] ABSTRACT

A tuning system employing a UHF tuner for tuning a television receiver over the UHF band and the ultraband is disclosed. The system employs indirect frequency synthesis in providing user initiated, microcomputer generated commands to the tuner in the form of a channel number and an operating mode control word. Inter-channel spacing of 6 MHz is maintained over both tuning bands with a respective channel in one band offset from the closest channel in the other band by 2 MHz.

10 Claims, 3 Drawing Figures

DUAL MODE UHF TUNING SYSTEM

This is a continuation, of application Ser. No. 367,656, filed Apr. 12, 1982 now abandoned.

CROSS REFERENCE TO RELATED APPLICATIONS

This application is related to co-pending application Ser. No. 578,462, filed Feb. 9, 1984 entitled All Channel Television Tuner in the names of Peter C. Skerlos and Peter Strammello, Jr. and co-pending application Ser. No. 401,449, filed July 26, 1982 entitled Switching Diplexer for Single Antenna Input Television Receivers in the name of Peter Strammello, Jr., both of which are assigned to Zenith Radio Corporation.

BACKGROUND OF THE INVENTION

This invention generally relates to television receiver tuning systems and more specifically is directed to an improved UHF tuning system capable of also tuning to channel frequencies in the so-called CATV ultraband.

Indirect frequency synthesizer tuning systems are well known and generally include a phase locked loop (PLL) synthesizer as a local oscillator for generating a plurality of local oscillator frequencies with a predetermined frequency separation maintained between adjacent frequencies. With each frequency representing an individual channel, output signals of a phase comparator in the PLL are applied via a low pass filter to electronic tuning elements generally including a plurality of varactor diodes. Each varactor diode is incorporated in one of several, coupled tunable circuits such as RF input/output amplifier stages, a mixer stage, and an oscillator stage. These various tunable stages are generally designated the "tuner" with the oscillator stage generally referred to as the local oscillator.

The PLL circuit generally utilized in a conventional indirect frequency synthesis tuner includes a variable, or programmable, divider, a reference crystal oscillator, a reference divider, a phase comparator, a low pass filter and a voltage controlled local oscillator. Upon receipt of a predetermined binary signal corresponding to the selected channel, the variable divider produces a frequency-divided signal obtained by dividing the frequency of an output of the voltage controlled oscillator by a predetermined dividing ratio. The frequency-divided signal and a reference frequency signal produced by dividing the output of the reference crystal oscillator are applied to the phase comparator, and an output signal of the phase comparator is applied via a low pass filter to the varactor diodes in the above mentioned tuner circuit which includes the voltage controlled oscillator. The voltage controlled oscillator output may then be provided to a mixer where it is combined with the received signal to produce an intermediate frequency (IF) or the tuner itself may convert the voltage controlled oscillator output to an IF signal for processing in the television receiver.

Tuners which include the aforementioned varactor diodes are generally referred to as electronic tuners. The basic limitation in these circuits is related to the restricted capacitance variation in the tuned circuits and the resulting limited frequency spectrum over which these resonant circuits may be tuned. By increasing the capacitance ratio of the varactor diodes in these tuned circuits, the frequencies available are correspondingly increased. However, the internal resistance of a varactor diode increases for higher rated breakdown voltages. Thus, while a greater capacitance voltage range may be obtained by using diodes of higher voltage breakdown ratings for increasing the tuning voltage, the increased varactor diode internal resistance limits tuning circuit gain and, as a result, is counter-productive. This characteristic of varactor diodes imposes an upper limit on the tuning voltage which can be applied to these tunable circuits. Various multi-band tuners are disclosed in the prior art, most of which use automatic band switching for electronically changing the tuned circuits in response to either user channel selection or to a converter device that converts CATV signal frequencies to a common intermediate frequency, generally that of VHF channel numbers 3 or 4.

The present invention provides a tuning system which employs a single tunable circuit for tuning a television receiver over either the UHF band or the CATV ultraband by compensating for differences in the transmitted frequencies of channels in these overlapping bands.

OBJECTS OF THE INVENTION

Accordingly, it is an object of the present invention to provide an improved tuning system for tuning a television receiver over the CATV ultraband and the UHF band.

A further object of the present invention is to provide an improved UHF tuner system which is compatible with the characteristics of the CATV transmission spectrum and therefore capable of tuning to channels therein.

A still further object of the present invention is to provide an improved tuning system capable of tuning continuously over the UHF band and CATV ultraband while maintaining the standard 6 MHz channel separation between adjacent channels in the respective bands.

SUMMARY OF THE INVENTION

In accordance with the invention a tuning system is provided for selectively tuning a television receiver to a first set of signals within a first frequency band and to a second set of signals within a second frequency band, wherein the first and second frequency bands overlap over at least a portion thereof, and includes viewer operable switch means for selectively generating a first control signal and a second control signal representing the first and second sets of signals, respectively, and tuning means operable in response to the first and second control signals for tuning the receiver to the first and second sets of signals, wherein each of the signals in the first set of signals is offset by a predetermined frequency from the corresponding signal closest in frequency in the second set of signals.

BRIEF DESCRIPTION OF THE DRAWINGS

The appended claims set forth those novel features believed characteristic of the invention. However, the invention itself as well as further objects and advantages thereof will best be understood by reference to the following detailed description of a preferred embodiment taken in conjunction with the accompanying drawings, in which:

DESCRIPTION OF THE PREFERRED EMBODIMENT

Figure 1:
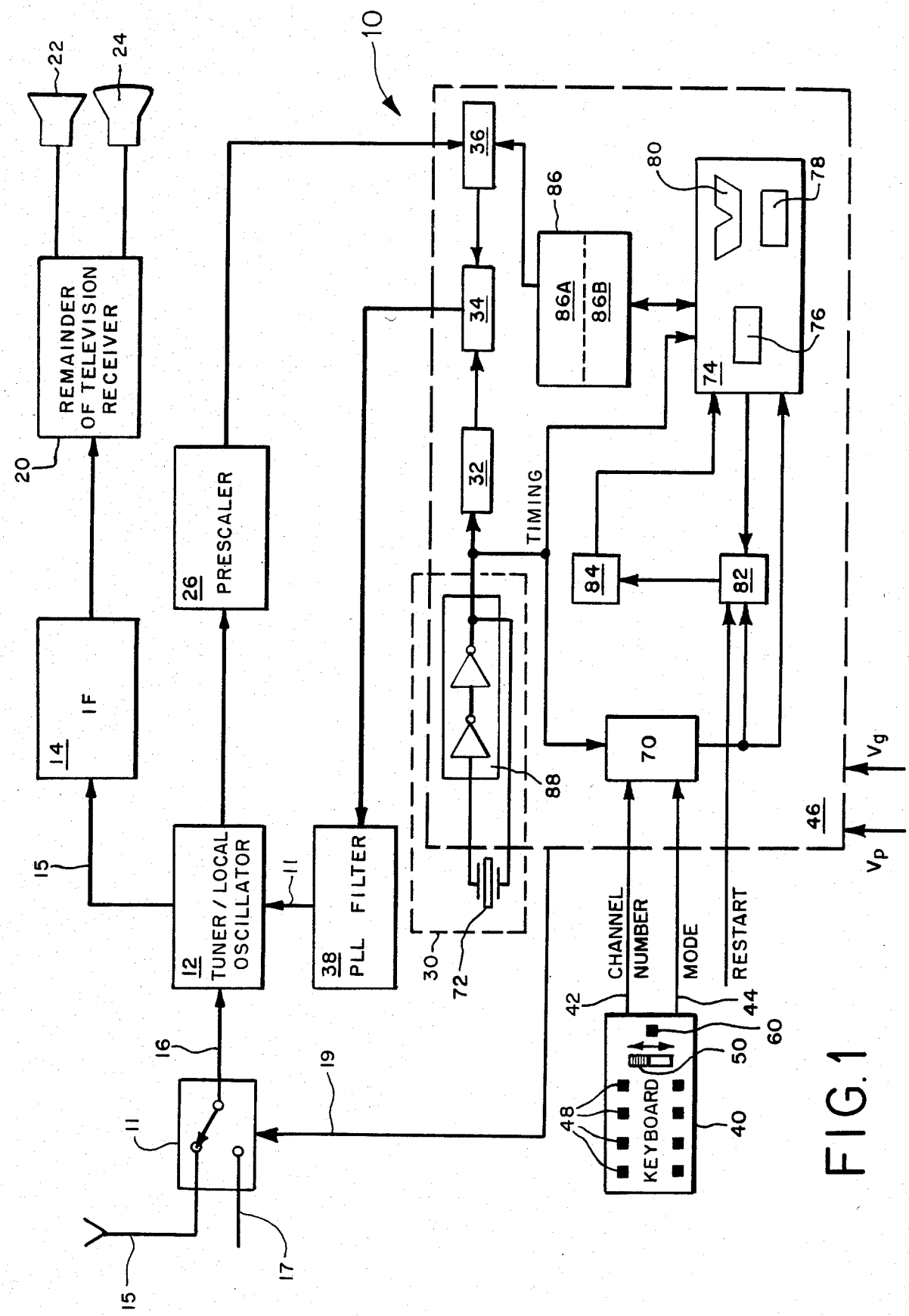
FIG. 1 is a block diagram of a tuning system in accordance with the present invention.

Referring to FIG. 1, there is shown a dual mode, UHF tuning system 10 in accordance with the present invention. This tuning system is particularly adapted for use in a conventional television receiver for tuning to frequencies in the UHF and CATV ultraband. It will be appreciated that a VHF tuner is not illustrated although, as will be seen, the microprocessor and memories include provision for generating tuning voltages and band switching voltages for VHF signal frequencies.

The present invention includes a switch 11 which permits either an RF signal in the UHF spectrum received by antenna 15 or a cable signal transmitted via cable 17 to be provided via line 16 to tuning system 10. The tuning system 10 includes a tuner/local oscillator 12 in the form of a voltage controlled oscillator which produces an output signal at a frequency determined by the magnitude of a direct current control potential applied to a control input of the tuner/local oscillator 12. The output signal of the tuner/local oscillator 12 is utilized as the output signal of the dual mode UHF tuning system 10 and is provided to an intermediate frequency (IF) stage 14. The tuner/local oscillator 12 includes a signal mixer portion (not shown) in which the tuner/local oscillator signal is combined, or mixed, with the received signal provided thereto via lead 16 to produce a lower, intermediate frequency signal. This intermediate frequency signal is then provided via lead 15 to an intermediate frequency stage 14 for amplification and filtering therein and thence to the remaining systems of the television receiver 20 including a loudspeaker 22 and a cathode ray tube 24 in providing audio and visual outputs to a viewer. The output signal of the tuner/local oscillator 12 is also provided to a fixed prescaler 26 for generating a divided down frequency and providing this lower frequency signal to a phase locked loop (PLL).

The PLL includes a variable, programmable divider 36 to which the output of the fixed prescaler 26 is provided for selectively dividing down the output of the tuner/local oscillator and providing this divided down signal to one input of a phase comparator 34. The PLL also includes a reference frequency signal source in the form of a reference crystal oscillator 30 the output of which is provided to the other input of phase comparator 34 after being divided down by a reference divider 32. When the frequencies of the output signals from the variable divider 36 and the reference divider 32 to the phase comparator 34 are exactly equal, the comparator output is 0. When there is any difference between these two frequencies, the phase comparator 34 will develop an output which, when passed through the PLL filter 38, provides a correction voltage to the tuner local oscillator 12 via lead 11 to change the local oscillator frequency until the two signals have exactly the same frequency. The tuner local oscillator 12 then assumes the stability of the reference crystal oscillator 30. This frequency and phase comparison is done continually in order to compensate for tuner oscillator drift.

For optimum phase comparator performance, the divided down tuner/local oscillator frequency should always be about equal to the other phase comparator input from the reference crystal oscillator 30 with a 1 KHz sampling rate utilized in a preferred embodiment of the present invention. Since the oscillator frequencies are different for each channel, a different divide ratio must be used for each selected channel in programming the variable divider 36. Programming of this divider is accomplished by means of microcomputer 46 which establishes the correct divide ratio for tuning to the selected channel in response to user inputs provided via keyboard 40. The control of tuning system 10 provided by microcomputer 46 is described below.

The output of the phase comparator 34 is a series of pulses, the duty cycle of which is a function of the difference between the reference frequency of 1 KHz and the divided down tuner local oscillator frequency. These pulses are integrated and filtered by the active PLL filter 38 resulting in a DC voltage with a negligible amount of 1 KHz ripple delivered to the tuner local oscillator 12 via line 11.

Whenever a new division ratio is provided to variable divider 36 from microcomputer 46 in response to a new entry on keyboard 40, the division ratio of the programmable, variable frequency divider 36 is changed from the ratio it previously had. Consequently, if the loop was properly phase and frequency locked prior to the entry of this new division ratio into the variable, programmable divider 36, the entry of the new ratio causes the output of the variable divider 36 initially to be of a frequency which is different from and which is not phase locked to the frequency of the reference signal provided by the reference crystal oscillator 30.

The tuner/local oscillator 12 is of the conventional superheterodyne type having an RF amplifier and a variable frequency oscillator (not shown). Typically, a continously variable tuning voltage output from the PLL filter 38 coupled to varactor diodes (not shown) in the tuner/local oscillator 12 permits the tuned circuits of the single band UHF tuner/local oscillator to be tuned to a particular frequency corresponding to a selected television channel in the UHF band.

Figure 2:
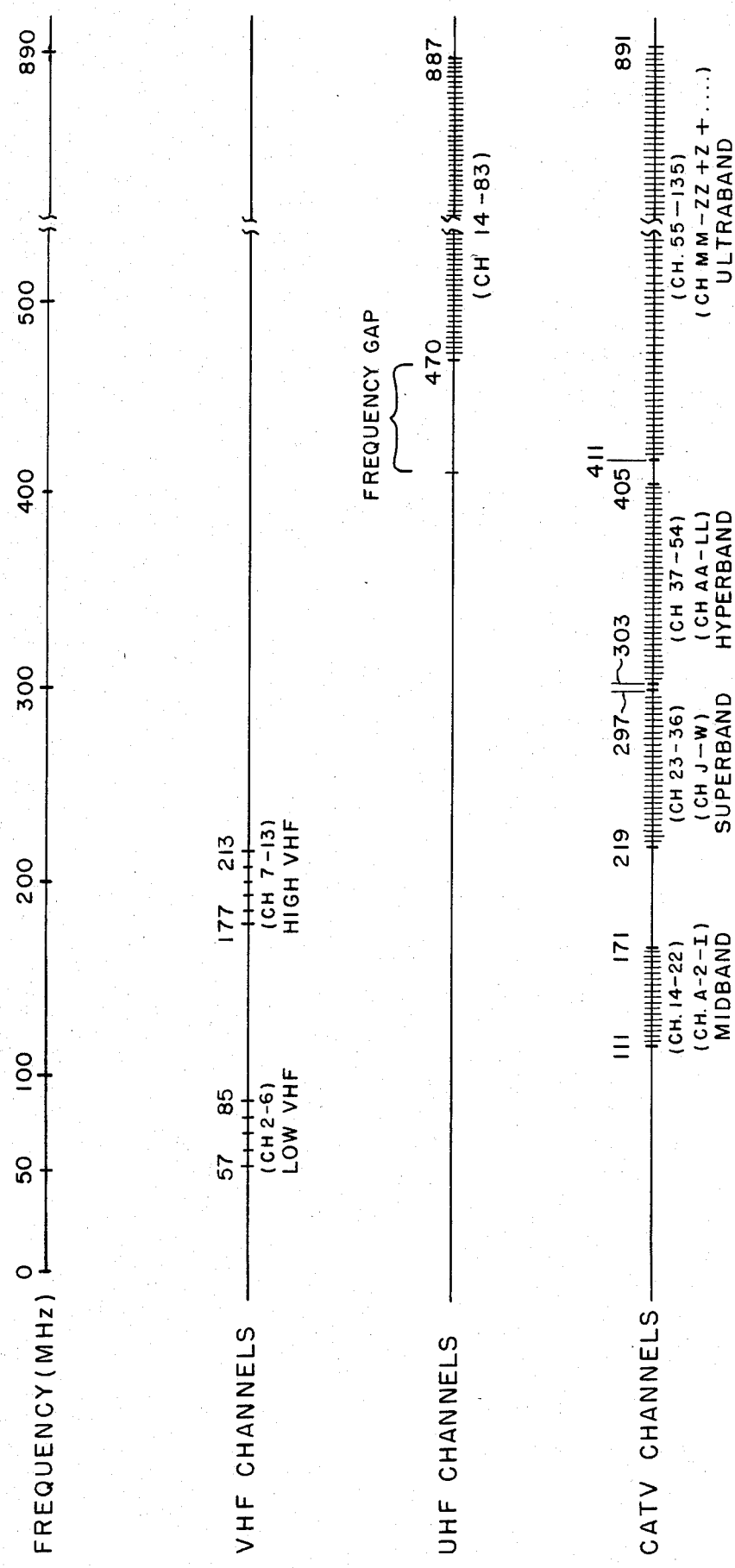
FIG. 2 illustrates the frequencies and corresponding channels to which the dual mode UHF tuning system of the present invention may be tuned.

Referring to FIG. 2, there is shown the frequency spectrum over which the television signals in the various bands are transmitted. The present invention envisions a UHF tuner that is also capable of operating in the CATV ultraband from 468–804 MHz with the individual UHF channels displaced 2 MHz above the nearest CATV channel. Thus, in the overlapping frequency spectrum of the UHF and CATV ultraband, the frequency of each CATV channel is displaced 2 MHz below the nearest UHF channel frequency with 6 MHz channel separation maintained in both bands in satisfying NTSC and FCC transmission requirements.

User inputs are provided by means of a plurality of touch pads 48 on keyboard 40 for selecting a desired channel number. In addition, keyboard 40 includes a mode select key 50 by means of which the dual mode capability of the UHF tuning system of the present invention may be realized in tuning to a CATV ultraband channel. Mode select key 50 may take the form of any conventional bistable switch element having two, separate states representing the UHF and CATV modes of operation. Binary signals representing the channel number and viewing mode selected are generated by keyboard 40 and transmitted to microcomputer 46 via data buses 42, 44, respectively.

Microcomputer 46 is a 4 bit, E/D MOS integrated circuit with a ROM 84, a RAM 86, a central processing unit (CPU) 74, an input counter 70, and a program counter 82. Microcomputer 46 stores instructions and data, periodically updates the stored data, compares both stored and real-time data and makes decisions based upon these comparisons by means of the logic instructions in providing system control. ROM 84 is a mask-generated, non-volatile, 4,096×8 bit memory matrix which includes 4,096 memory locations or "bytes" of 8 bits each. Program instructions and data are stored in ROM 84 which has a 79 instruction capacity. 8 bit binary patterns are used by ROM 84 from which instructions and data are sequentially removed under the control of program counter 82 in reading out each instruction to be executed for carrying out program functions. RAM 86 has an X-register, Y-register memory matrix organization for temporary memory storage of 256 words of 4 bits each. Each bit may be used as a flag to indicate whether a particular event has occurred or the individual flags can be used in combination in the form of a counter. When instructed, the contents of a directly addressed location in RAM 86 are transferred to accumulator 78 and the reverse process may also be accomplished by means of the proper instruction. RAM 86 organization may be broken up into an upper RAM map 86A and a lower RAM map 86B. The lower RAM map which is shown in Table I provides control of television receiver tuning, video display presentation and other functions related to television receiver operation. The upper RAM map which is shown in Table II also includes television receiver control instructions, but also contains other television receiver functions which are not related to the present invention including a telephone dial-out capability, the display of a dialed telephone number, and the timing involved in the television receiver AUTO-ON and AUTO-OFF functions. These latter operations, and the corresponding locations in RAM 86 necessary for their performance do not form a part of the present invention and are not further discussed herein

TABLE I

| X | Y | 0 | 1 | 2 | 3 | 4 | 5 | 6 | 7 | 8 | 9 | 10 | 11 | 12 | 13 | 14 | 15 | Y | X |
|---|---|---|---|---|---|---|---|---|---|---|---|---|---|---|---|---|---|---|---|
| 7 | 1 | Every 20 μs | On Set Key | <Key In Data> | | TEMP STORAGE POWER | | | MSD | <REMOTE Current Code LSD | YOAdr | Rmt Pulse Seq. | Rmt Flag | Rmt Erase Counter | Rmt Low Counter 1 | Rmt Low Counter 2 | Rmt Timing | 1 | 7 |
| | 2 | | | MSD | LSD | | | | | > 2 | | | | | | | | 2 | |
| | 4 | | | | | | | | | | | | | | | | | 4 | |
| | 8 | | | | | | | | | 1 | | | | | | | | 8 | |
| 6 | 1 | > | | | | | | PREFERRED CH MNOS WRITE FLAG | < | TEL WRT Flag | YOAdr | X-Adr | | ADDRESS CALCULATION BUFFER < | | CRT | — | 1 | 6 |
| | 2 | | | | | | | | | > | | | | | | | | 2 | |
| | 4 | | | | | | | | | | | MNOS | | | | | | 4 | |
| | 8 | | | | | | | | | | | | | | | | | 8 | |
| 5 | 1 | 64 | 68 | 72 | 76 | 80 | 14 | 18 | 22 | 26 | 30 | 34 | 38 | 42 | 46 | 50 | 54 | 1 | 5 |
| | 2 | 65 | 69 | 73 | 77 | 81 | 15 | 19 | 23 | 27 | 31 | 35 | 39 | 43 | 47 | 51 | 55 | 2 | |
| | 4 | 66 | 70 | 74 | 78 | 82 | 16 | 20 | 24 | 28 | 32 | 36 | 40 | 44 | 48 | 52 | 56 | 4 | |
| | 8 | 67 | 71 | 75 | 79 | 83 | 17 | 21 | 25 | 29 | 33 | 37 | 41 | 45 | 49 | 53 | 57 | 8 | |
| 4 | 1 | 0 | 4 | 8 | 12 | 16 | 20 | 24 | 28 | 32 | 36 | 40 | 44 | 48 | 51 | 56 | 60 | 1 | 4 |
| | 2 | 1 | 5 | 9 | 13 | 17 | 21 | 25 | 29 | 33 | 37 | 41 | 45 | 49 | 53 | 57 | 61 | 2 | |
| | 4 | 2 | 6 | 10 | 14 | 18 | 22 | 26 | 30 | 34 | 38 | 42 | 50 | 51 | 54 | 58 | 62 | 4 | |
| | 8 | 3 | 7 | 11 | 15 | 19 | 23 | 27 | 31 | 35 | 39 | 43 | 47 | 51 | 55 | 59 | 63 | 8 | |
| 3 | 1 | KEY ON Counter | 50.125 μs | 250.625 μs | 2255.125 μs | 45s 30s | > 10s | TEN RASTER KEY COUNTER | PO DISP. COUNTER | > 1's | <VOLUME 10's | KEY MUT CH.CHANGE | BIT | SD/P TEL SKIP | DISP MODE | KEY JOB FLAG | PLL Sel (2nd) | 1 | 3 |
| | 2 | | | | | | | | | | | KEY ON | | | | | | 2 | |
| | 4 | | | | | | | | | | | | | | | | | 4 | |
| | 8 | | | | | | | | | | | | | | | | | 8 | |
| 2 | 1 | Tel Input Digit Count | — | ROOT Flag | JOB PR Scan PR CAK 1 Sec | SW 50/60 Select | > 10s | NOWTIME .1s | | 1/5, ¼ | CLK.INT CLK.STRB | TEL PULSE COUNT | TEL I.D. or D. TIMER | TEL DIAL DIGIT COUNT | RECALL FLASH FLAG | INIT I.D. or D. FLAG | PLL SEL (LSD) | 1 | 2 |
| | 2 | | — | | | | | 1s | | | | | | | | | | 2 | |
| | 4 | | | | | | | | | | | | | | | | | 4 | |
| | 8 | | | | | | | | | | | | | | | | | 8 | |
| 1 | 1 | AFC Timer 1 | AFC Timer 2 | AFC Timer Flag | AFC Timer Count | AFC Step Count | AFC OK Flag | LO Count | HI Count | Disc 1 Input | — | ON MUT OFF MUT RDY MUT | MNOS E/W Count | MNOS E/W Flag | PLL REF MIN | PLL REF MAX | PLL REF (2ND) | 1 | 1 |
| | 2 | | | | | | | | | | — | | | | | | | 2 | |
| | 4 | | | | | | | | | | — | | | | | | | 4 | |
| | 8 | | | | | | | | | | | | | | | | | 8 | |
| 0 | 1 | CH/CLK MOD PWF/CATY AF/PLL | UHF Super Mid Hi VHF | <TEMP> | | CH 10's | DISP 1's | CH 10's | RCV 1's | — | SW Buffer | SW BOUNCE | A OFF BURST MOM. | TEMP | A ON BURST MOM. | TEMP | PLL REF (LSD) | 1 | 0 |
| | 2 | | | | | | | | | — | | | | | | | | 2 | |
| | 4 | | | | | | | | | — | | | | | | | | 4 | |
| | 8 | | | | | | | | | | | | | | | | | 8 | |
| X | Y | 0 | 1 | 2 | 3 | 4 | 5 | 6 | 7 | 8 | 9 | 10 | 11 | 12 | 13 | 14 | 15 | Y | X |

TABLE II

| X | Y | 15 | 14 | 13 | 12 | 11 | 10 | 9 | 8 | 7 | 6 | 5 | 4 | 3 | 2 | 1 | 0 | Y | X |
|---|---|----|----|----|----|----|----|----|----|----|----|----|----|----|----|----|----|----|----|
| 15 | 1 2 4 8 | | | | | | | | | | 15 Sec TEL AOFF FLAG | 15.3 s TEL AOFF TIMER | 5.1 s TEL AOFF TIMER | .32 TEL AOFF TIMER | 5.2 s TEL REDIAL FLAG | 5.1 s TEL REDIAL TIMER | .32 TEL REDIAL TIMER | 1 2 3 8 | 15 |
| 14 | 1 2 4 8 | | < 1M 10M | A ON + 1 Hr | PM/AM > | | | | | | | | | | | | | 1 2 4 8 | 14 |
| 13 | 1 2 4 8 | | | | | | | | | | 82 83 | 78 79 80 81 | 74 75 76 77 | 70 71 72 73 | 66 67 68 69 | 62 63 64 65 | 58 59 60 61 | 1 2 4 8 | 13 |
| 12 | 1 2 4 8 | | | | | | | | 116 117 118 119 | 112 113 114 115 | 108 109 110 111 | 104 105 106 107 | 100 101 102 103 | 96 97 98 99 | 92 93 94 95 | 88 89 90 91 | 84 85 86 87 | 1 2 4 8 | 12 |
| 11 | 1 2 4 8 | INIT TEL REDIAL FLAG | | 13th TEL DIGIT < | 12th | 11th | 10th | 9th | 8th | 7th | 6th | 5th | 4th | 3rd | 2nd | 1st TEL DIGIT > | 1 2 4 8 | 11 |
| 10 | 1 2 4 8 | | | 13th TEL DIGIT < | 12th | 11th | 10th | 9th | 8th | 7th AUTO | 6th DIAL #2 | 5th | 4th | 3rd | 2nd | 1st TEL DIGIT > | 1 2 4 8 | 10 |
| 9 | 1 2 4 8 | | | 13th TEL DIGIT < | 12th | 11th | 10th | 9th | 8th | 7th AUTO | 6th DIAL #1 | 5th | 4th | 3rd | 2nd | 1st TEL DIGIT > | 1 2 4 8 | 9 |
| 8 | 1 2 4 8 | AON AOFF FLAG | < M 10M | NOW TIME HR | PM/AM PWR FAIL | > | < AUTO OFF > M 10M HR | | LAST NUMBER | PM/AM RUNTAIG SET/MUT | < M | ADN 10M | > HR | PM/AM RUNTAIG > SET/MUT | | | 1 2 4 8 | 9 |
| X | Y | 15 | 14 | 13 | 12 | 11 | 10 | 9 | 8 | 7 | 6 | 5 | 4 | 3 | 2 | 1 | 0 | Y | X |

Information stored in RAM 86, which is a volatile memory, is lost when the television receiver is turned off. However, information stored in ROM 84 is not lost either when the receiver is turned off or when power is removed from the television receiver. When the television receiver is again turned on, the microcomputer program initializes RAM data from ROM 84 which causes the binary signals representing the first instruction stored in ROM 84 to be coupled to CPU 74 and causes various other portions of microcomputer 46 to be initialized for proper future operation when power is applied to the microcomputer 46. For example, when the television receiver is turned on, the program counter (PC) 82 is initialized by means of a RESTART signal. Thus, the program proceeds to the initial instruction of the routine stored in ROM 84 and provides this instruction to CPU 74.

CPU 74 is made up of an instruction decoder (ID) 76, an accumulator (ACC) 78 and an arithmetic and logic unit (ALU) 80. Instruction decoder 76 receives the program instructions from ROM 84 provided to CPU 74 and, after analyzing its contents, initiates ALU and ACC operations. The instruction decoder 76 then provides a control signal to program counter 82 which, in turn, directs the program to proceed to the next designated instruction in ROM 84.

It is by means of this closed-loop instruction control system that ROM 84 provides the various controlling instructions to CPU 74 in carrying out the program stored in ROM 84. Accumulator 78 is a 4-bit register and is the primary working register of microcomputer 46. The contents of accumulator 78 derived from RAM 86 or earlier from ROM 84 are compared with instructional data from ROM 84 in ALU 80 with the results of these comparisons being stored in control bit locations in RAM 86. ALU 80 receives binary control signals from instruction decoder 76 and performs the required arithmetic and logic operations including addition, incrementing, Boolean logic operations, straight transfer, etc.

The input control signals generated in response to user inputs provided to keyboard 40 are transmitted to input counter 70. Input voltages $V_p$ of $+5$ VDC and $V_g$ of $+8$ VDC are provided for energizing microcomputer 46. Input counter 70 performs as a binary series of flip-flops to permit gated counting of input signals interrupted by the periodic analysis of these input pulses with the subsequent contents of input counter 70 being provided to accumulator 78 in CPU 74. The counted pulses are then compared in ALU 80 with stored pulse counts in RAM 86 and preset data in ROM 84. Based upon this comparison, logic analysis command signals are provided by means of instruction decoder 76 in CPU 74 to program counter 82 in directing the program to desired instruction locations in ROM 84. Also as a result of the comparisons and decisions made by ALU 80, data is transmitted from CPU 74 to RAM 86 where it is stored for further comparison with subsequent outputs from input counter 70. During this process ALU 80 is controlled by inputs from the instruction decoder 76 which, in turn, is driven by various commands provided by ROM 84. This process is continued until the input commands from keyboard 40 are received and stored in the designated control memory locations in RAM 86.

Microcomputer timing is provided by an oscillator 72 which is in the form of a series resonant device both sides of which are connected to the microcomputer 46 because of the high operating oscillator frequency, i.e., 7.16 MHz. This permits most of the master clocking circuitry to be incorporated within microcomputer 46. One output of the series resonant device 72 is coupled to the input of clock generator 88 with the other output of the series resonant device coupled to the output of the clock generator 88. After processing, these clock signals are provided to the central processing unit 74 and to a counter in RAM 86 under the control of instructions stored in ROM 84 for counting the input pulses of the control signals from the keyboard 40. The combination of the series resonant device 72 and the clock generator 88 comprise the reference crystal oscillator 30 of the phase locked loop utilized in the present invention. In a preferred embodiment of the present invention, the clock generator 88, the reference and programmable dividers 32, 36 and the phase comparator 34 are included in the microcomputer integrated circuit. Thus, these components of the phase locked loop are included in the block 46 designating the microcomputer.

RAM memory locations are designated by $M(X,Y)$ terminology with words expressed generally in hexadecimal code. For example, the received channel designation is located in the $M(0,7)$ location (units) and the $M(0,6)$ location (tens). Similarly, the display channel numbers are stored in memory locations $M(0,5)$ (units) and $M(0,4)$ (tens). When channel numbers are selected by means of the keyboard 40 they are immediately stored in RAM memory locations $M(0,5)$ and $M(0,4)$.

Referring to Tables I and II, there is shown the contents of the lower and upper RAM maps, respectively. Binary digital tuning data including band switch data corresponding to various channel numbers are stored in rows 4 and 5 in the lower RAM map 86B and rows 12 and 13 in the upper RAM map 86A. More particularly, VHF channels 1-13 are stored in lower RAM locations $M(4,0)$ to $M(4,3)$. CATV Midband channels 14-22 are stored in lower RAM map locations $M(4,3)$ to $M(4,5)$. CATV Superband channel information is stored in lower RAM map locations $M(4,5)$ to $M(4,9)$. CATV Hyperband channel information is stored in lower RAM map locations $M(4,9)$ to $M(4,13)$. CATV Ultraband channel information is stored in lower RAM map locations $M(4,13)$ to $M(4,15)$. In addition, Ultraband channel number information is stored in upper RAM map 86A in locations $M(12,0)$ to $M(12,12)$. Similarly, UHF tuning information is stored in lower RAM map locations $M(5,5)$ to $M(5,15)$. UHF tuning information is also stored in upper RAM map 86A locations $M(13,0)$ to $M(13,6)$.

In response to a user entered input via keyboard 40, the control signals are processed in a manner as described above so as to access a particular RAM location which contains digital information corresponding to the channel number selected. As described earlier, two inputs are provided from the keyboard 40 to microcomputer 46, i.e., channel number information and the mode select information representing either UHF or CATV ultraband operation. If the mode select switch is in the CATV position, one of those memory locations in which is stored CATV ultraband channel information is accessed with the contents thereof read out of RAM 86 and provided to the programmable divider 36. If the mode select switch 50 is in the UHF mode of operation, the appropriate RAM memory location containing UHF tuning information corresponding to the selected channel is accessed and the contents thereof are read out of RAM 86 and provided to the programmable divider 36. The digital words thus read out from RAM 86 program divider 36 to divide the VCO signal by the appropriate number so as to tune the tuner/local oscillator to the selected channel. In addition, appropriate mode control data is read from RAM 86 in response to the user initiated input to mode select switch 50 and provided from microcomputer 46 via line 19 to switch 11. Signals from the selected frequency band, i.e., UHF or CATV ultraband, are then provided to tuning system 10.

The channel number and mode select information provided via data buses 42, 44, respectively, to the microcomputer 46 in digital code may be combined therein in generating composite digital data containing both of the aforementioned pieces of information in a conventional manner. For example, by conventional programming of microcomputer 46 the channel number and mode select switch signals may be multiplexed as an output provided by the input counter 70 to the program counter 82 and the central processing unit 74. The timing signals provided by the series resonant device 72 could then be utilized for controlling the processing of the thus formed multiplexed signals within microcomputer 46. In addition, the channel number and mode select control signals provided from keyboard 40 to microcomputer 46 could be combined so as to form yet a third composite digital signal which includes these two input control signals. This could be accomplished by conventional digital signal logic circuitry within microcomputer 46 which would be known to one skilled in the art of digital signal processing circuit design and thus does not form a part of the present invention and will not be further described herein.

When a desired channel number is entered on the keyboard 40 by means of touch pads 48, this data is provided to RAM 86. These received pulses are then temporarily stored in accumulator 78 and later compared in ALU 80 with program data recalled from ROM 84. When command inputs are received and verified by the program in the microcomputer 46 as being valid commands, the individual commands, following program analysis in the ALU 80, are stored in selected memory locations in RAM 86. This is a sequential process for as subsequent commands are detected by the input counter 70, they are similarly stored in appropriate memory locations in RAM 86 until an entire valid code is detected by the CPU 78 which sets a flag in a predetermined memory site in RAM 86. When the program later detects this flag in RAM 86, the stored command code is read from RAM 86 and provided to the reference and programmable dividers 32, 36 for providing the proper control voltage to the tuner/local oscillator 12. This tuning voltage signal is determined by the particular channel number selected on keyboard 40. More detailed information regarding the microcomputer chip configuration and operation utilized in a preferred embodiment of the present invention is contained in the Matsushita Electronics Corporation publication entitled "MN 1400 Series: 4-Bit 1-Chip Microcomputer".

A channel is selected by entering the desired channel number by means of the touch pads 48 on the keyboard 40 and then depressing the pressure sensitive "ENTER" key 60. If the "ENTER" key 60 is selected within 4.5 seconds of channel number entry, the selected channel number information stored in the lower RAM map locations M(0,4) and M(0,5) is transferred to the RAM tuning memory location in the lower RAM map locations M(0,6) and M(0,7). The television receiver is then tuned to the newly selected channel. If the "ENTER" key 60 is not selected within 4.5 seconds of channel number entry the television receiver is not tuned to another channel and tuning information stored in the aforementioned RAM tuning memory locations is transferred back to the aforementioned RAM display storage memory locations with channel number display data reverting to the originally selected channel. In this manner, the channel number display (not shown), if recalled, will always indicate the channel actually being viewed. The channel number display thus does not change, but merely "times out" after a predetermined time interval. This unique manner in which channel numbers are entered is the subject of U.S. Pat. No. 4,279,035 issued July 14, 1981, in the name of the present applicant, and assigned to the assignee of the instant application. The contents of the aforementioned patent are hereby incorporated by reference, however, since the details of this channel number entry system do not form a part of the present invention it will not be further described herein. It should also be noted that the present invention is not limited to this particular type of channel number entry system, but is compatible with any conventional method for entering channel numbers in a television receiver.

The manner in which digital signals are processed within the dual mode, UHF tuner of the present invention in tuning to a selected channel in either the UHF band or the CATV ultraband will now be explained with reference to the flow chart shown in FIG. 3. In referring to FIG. 3, an oval symbol indicates the start of an operational sequence, a rectangle indicates an instruction or set of instructions resulting in the performance of a control function and a diamond indicates a decision point based upon the comparison of binary signal inputs.

POWER ON

Figure 3:
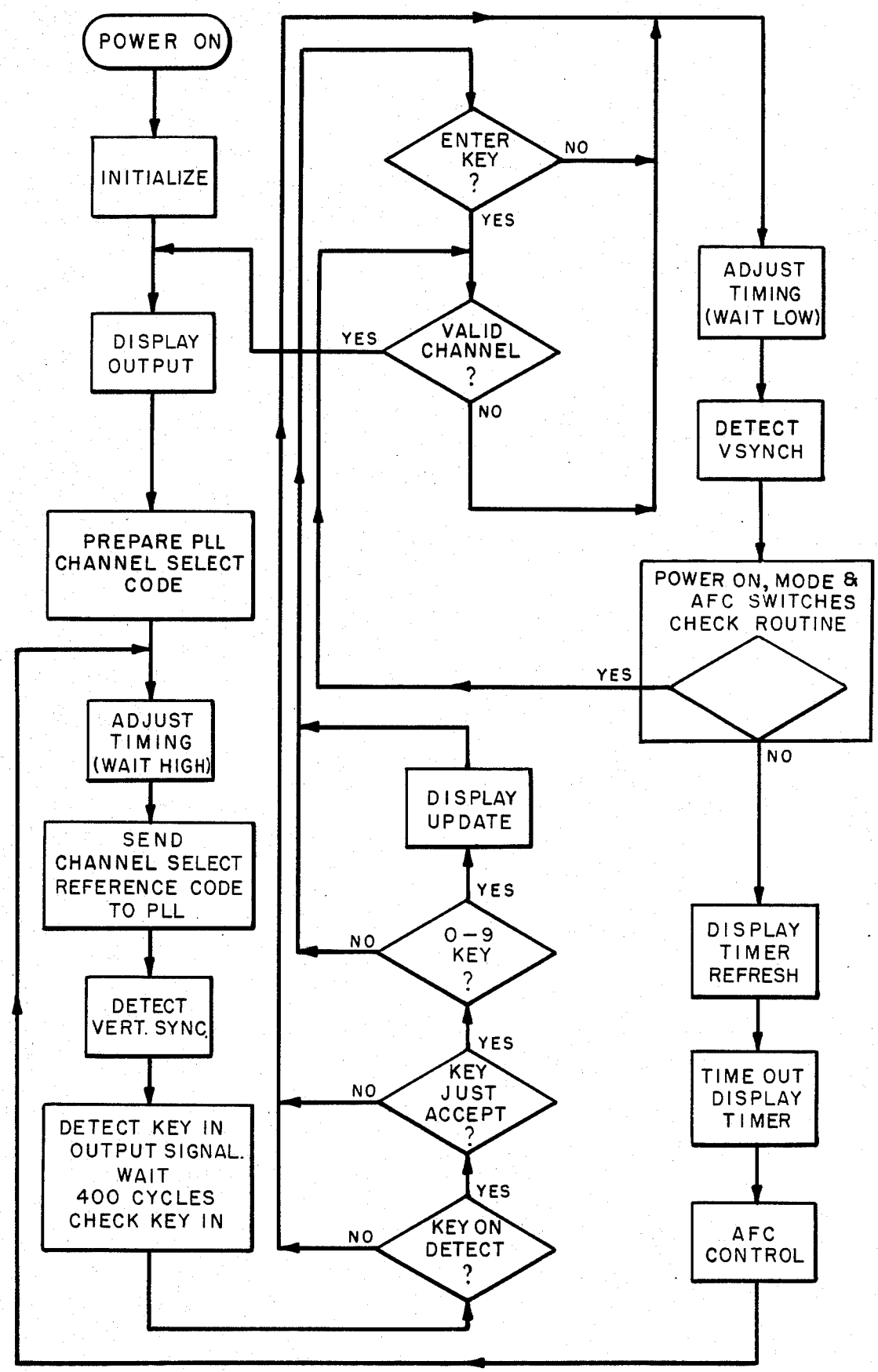
FIG. 3 is a detailed flow chart showing digital signal flow among the various components of the television receiver tuning system shown in FIG. 1 in tuning to a selected channel in either the UHF or CATV ultraband in accordance with the present invention.

As indicated in FIG. 3, power must be applied to the television receiver before the channel number entry process is initiated. The ROM, possessing a non-volatile memory, retains stored data without power applied to the television receiver. The RAM, possessing a volatile memory, looses stored data when power is removed from the television receiver with the result that data must be again stored in RAM when power is again applied to the television receiver.

INITIALIZE

The microcomputer 46 turns itself on when power is applied to the television receiver. Thereafter memory storage locations in the RAM 86 and other portions of the microcomputer 40 are initialized to predetermined conditions established by outputs from the ROM 84. Data transferred from ROM 84 to RAM 86 includes program operating instructions and constants, e.g., tuning data, keyboard scanning data, etc. Instructions output by the ROM 84 are decoded by the microcomputer's CPU 74 before being transmitted to the various microcomputer control elements. Control logic in the form of the microcomputer's arithmetic logic unit (ALU) 80 then implements these instructions.

DISPLAY OUTPUT

When power is initially applied to the television receiver channel number 2 is presented on a channel number display (not shown). Upon turning the television receiver "off" and then "on", the previously tuned to channel number will be recalled from RAM 86 and presented on the channel number display. Upon power interruption to the television receiver the contents of RAM 86 are erased with the result that upon reapplication of power channel number 2 will be presented on the channel number display and will be tuned to by the receiver.

PREPARE PLL CHANNEL SELECT CODE

With the display channel number decoded by the microcomputer, appropriate tuning data is generated by programs in ROM 84 and stored in RAM 86 for transfer to the PLL. The automatic frequency control (AFC) flag and the selected channel number provide the microcomputer 46 with the necessary inputs for generation of this PLL coded tuning data.

ADJUST TIMING

The microcomputer then looks at the system clock as generated by the reference crystal oscillator 30 in the PLL the output of which is divided by the reference divider 32 to produce a 200 Hz clocking signal to which all system processes are synchronized. The microcomputer 46 then waits for a high to low transition of the timing pulse in establishing a timing reference signal from which all tuning steps are measured.

SEND CHANNEL SELECT REFERENCE CODE TO PLL

After system timing is established the microcomputer 46 then sends the reference coded channel select tuning data to the PLL where it is addressed to appropriate latches (not shown) in providing inputs to the variable divider 36 and the reference divider 32.

DETECT VERTICAL SYNC

The microcomputer then compares frequency, amplitude and duty cycle of the received signal with corresponding reference data stored in memory in detecting the presence or absence of a vertical sync signal.

DETECT KEY IN, OUTPUT SIGNAL, WAIT 400 CYCLES, CHECK KEY IN

Depression of a key on the keyboard 40 is then detected by the microcomputer by means of scanning signals output by the microcomputer. The system then waits 400 cycles which is twice the program period in executing a key debounce routine to allow for keyboard entry stabilization and the rejection of spurious signals which may occur only once in a given cycle. Following this 400 cycle interval the system then retransmits its keyboard scanning signal to allow for the detection of key depression. If a key input is accepted, data corresponding to that key is stored in RAM 86 for later use.

KEY ON DETECTED

The program then arrives at its first decision point at which key selection is determined followed by appropriate program branching. At this point in the program the system determines merely if a key has or has not been selected. At this point the program is able to sense whether an input signal represents a valid key selection or a spurious signal or an illegal entry. If a valid key entry is not detected the program proceeds to the ADJUST TIMING (WAIT LOW) routine which will be described later. If a valid key entry is detected the program branches to the KEY JUST ACCEPTED routine.

KEY JUST ACCEPTED

The program then undergoes a detailed analysis in determining whether a valid or invalid key has been selected. It eliminates erroneous keying inputs such as multiple key entries, key debounce inputs, etc.

ZERO TO NINE KEY

The microcomputer 46 then checks RAM key data for possible branch to the VALID CHANNEL routine. If the key was not numeric, the program branches to the ENTRY KEY routine.

DISPLAY UPDATE

If one of the numeric keys on keyboard 40 has been selected, the appropriate input is provided by the keyboard 40 to the microcomputer 46 in presenting the selected channel number on the channel number display.

ENTER KEY

Whether or not a numeric key has been selected the program then proceeds to the "ENTER" routine which checks to see if the channel number selected is a valid channel number or an illegal channel number. This is done by comparing the selected channel number with the contents of the microcomputer memory resulting in the erasure of the channel number from a digital display (not shown) if the channel number selected is illegal. The illegal channel number is then replaced with the previously selected channel number and the program continues to the ADJUST TIMING (WAIT LOW) routine.

VALID CHANNEL

If the result of the ENTER KEY inquiry indicates that a valid channel has been selected the program proceeds to the VALID CHANNEL routine and from there branches back to the start of the channel entry program. If the VALID CHANNEL check indicates an invalid channel has been received the program proceeds to the ADJUST TIMING (WAIT LOW) routine.

ADJUST TIMING

The ADJUST TIMING routine permits the program to idle at a low timing state looking for a transition from low to high before it continues on. A transition from low to high of the timing signal would establish the one-half period mark of program execution and thus tells the microcomputer when one-half of the program has been executed.

DETECT VERTICAL SYNC

Following the adjustment of program timing the program again looks for the presence of a vertical sync signal by monitoring received signal frequency, amplitude and duty cycle.

POWER ON/AFC/CATV SWITCH CHECK ROUTINE

The program then looks at the status of the power switch. If the switch is off it idles, continuously testing the status of the power switch. If the result of this test indicates that the power switch is on, it continues in the program checking the status of the mode switch 50. If a change in state of any one of these three checks is sensed by the microcomputer the program is directed back to the VALID channel check. If the result of this routine indicates that the power switch is on or that the state of the mode switch has not been changed since the last cycle of the program, the program continues onto the TIME OUT DISPLAY TIMER routine.

DISPLAY TIMER REFRESH

The microcomputer 46 updates the display timer RAM data and again recalls from RAM 86 the channel number and transmits appropriate digital data to the channel number display based on the timer data.

TIME OUT DISPLAY TIMER

Following the second program update of the digital display, the system then checks to see if the "ENTER" key has been selected within 4.5 seconds of channel number entry. This is accomplished by the TIME OUT and DISPLAY TIMER routine which causes the channel number display data to revert to the previously selected channel number if the "ENTER" key is not selected within 4.5 seconds of channel number entry. This also results in the television receiver remaining tuned to the originally tuned to channel. If the "ENTER" key is selected within 4.5 seconds of channel number entry, the newly selected channel number remains displayed on an LED display (not shown) and the microcomputer 46 provides the phase lock loop with appropriate tuning data to tune to the displayed channel number.

AFC CONTROL

Following the tuning to a new channel the program executes an AFC CONTROL routine in more accurately tuning to the newly selected channel. Details of the AFC CONTROL routine are described in U.S. Pat. No. 4,280,140, filed Feb. 19, 1980, entitled "Microcomputer-Controlled One-Step-Back Automatic Frequency Control System", in the name of Peter C. Skerlos, which is assigned to the assignee of the present application, the contents of which are hereby incorporated by reference in the present application.

There has thus been described a dual mode, UHF tuning system capable of also tuning a televison receiver over the CATV ultraband.

While particular embodiments of the present invention have been shown and described, it will be apparent to those skilled in the art that changes and modifications may be made therein without departing from the invention and its broader aspects. The aim in the appended claims, therefore is to cover all such changes and modifications as fall within the true spirit and scope of the invention.

I claim:

1. A UHF tuning system for a television receiver including a phase locked loop circuit wherein the frequency of a voltage controlled oscillator is locked to a reference signal, said system comprising:

keyboard means for selecting a desired channel number from a first group of channels or from a second group of channels and generating output signals representing said selected channel number;

mode control means selectively operable for identifying either a first mode of operation for tuning to channels in said first group or a second mode of operation for tuning to channels in said second group and for generating first or second control signals in response to said first or second modes of operation, respectively;

signal processing means coupled to said keyboard means and said mode control means and responsive to said channel number output and said control signals respectively received therefrom and coupled to said voltage controlled oscillator for generating a local oscillator signal having one of a plurality of equally spaced first set of frequencies for tuning to a channel in said first group of channels in response to said first mode of operation or for generating a local oscillator signal having one of a plurality of equally spaced second set of frequencies for tuning to a channel in said second group of channels in response to said second mode of operation, wherein the separation between adjacent frequencies in said first and second sets of frequencies is equal and wherein each of said first set of frequencies is offset from a corresponding one of said second set of frequencies by a predetermined amount, with said predetermined amount less than 6 MHz; and means for mixing the local oscillator signal with a received television signal for developing an intermediate frequency signal for processing in said television receiver.

2. The system of claim 1 wherein said first mode of operation includes television receiver operation over the UHF frequency band and said second mode of operation includes television receiver operation over the CATV Ultraband.

3. The system of claim 2 wherein said CATV Ultraband includes frequencies of 468-804 MHz.

4. The system of claim 1 wherein the separation between adjacent frequencies in said first and second sets of frequencies is 6 MHz.

5. The system of claim 1 wherein the corresponding frequencies in said first and second sets of frequencies are offset from one another by 2 MHz.

6. The system of claim 1 wherein said phase locked loop circuit includes a programmable divider coupled to said voltage controlled oscillator and responsive to an oscillating output signal therefrom, a reference frequency oscillator, a phase detector coupled to said programmable divider and said reference frequency oscillator and responsive to the outputs therefrom for generating a signal representing a phase difference between the outputs from said programmable divider and said reference frequency oscillator, and a low pass filter connected between the phase comparator and said voltage controlled oscillator and having an output signal representing a phase difference between the outputs from said programmable divider and said reference frequency oscillator.

7. A system for selectively tuning a television receiver to a first set of signals within a first frequency band and to a second set of signals within a second frequency band and wherein said first and second frequency bands overlap over at least a portion thereof, said system comprising:

viewer operable switch means having a first position for generating a first control signal and a second position for generating a second control signal representing respective first and second modes of operation for tuning to said first and second sets of signals, respectively; and tuning means operable in response to said first and second control signals for tuning said television receiver to said first and second sets of signals, respectively, and wherein each of said signals in said first set of signals is offset by a predetermined signals from the corresponding signal closest in frequency to it in said second set of frequencies.

8. A system as in claim 7 wherein said first set of signals comprises UHF television signals and said second set of signals comprises CATV Ultraband television signals.

9. A system as in claim 8 wherein said predetermined frequency offset between corresponding UHF and CATV signals closest in frequency is 2 MHz.

10. A system as in claim 7 wherein the frequencies of said first set of signals is between 470 MHz and 806 MHz and the frequencies of said second set of signals is between 468 MHz and 804 MHz.

* * * * *

UNITED STATES PATENT AND TRADEMARK OFFICE
CERTIFICATE OF CORRECTION

PATENT NO. : 4,516,170
DATED : May 7, 1985
INVENTOR(S) : Peter C. Skerlos

It is certified that error appears in the above-identified patent and that said Letters Patent is hereby corrected as shown below:   On the title page;

In the filing date, cancel "Feb. 4, 1984" and insert --Dec. 22, 1983.

In column 19, line 2, cancel "signals" and insert --frequency--.

In column 19, line 3, cancel "frequencies" and insert --signals--.

Signed and Sealed this

Twenty-seventh Day of August 1985

[SEAL]

Attest:

DONALD J. QUIGG

Attesting Officer    Acting Commissioner of Patents and Trademarks